(12) United States Patent
McKnight

(10) Patent No.: US 6,477,043 B2
(45) Date of Patent: Nov. 5, 2002

(54) DATA AND POWER STORAGE DEVICE

(75) Inventor: Russell F. McKnight, Sioux City, IA (US)

(73) Assignee: Gateway, Inc., Poway, CA (US)

( * ) Notice: Subject to any disclaimer, the term of this patent is extended or adjusted under 35 U.S.C. 154(b) by 0 days.

(21) Appl. No.: 09/746,360

(22) Filed: Dec. 21, 2000

(65) Prior Publication Data

US 2002/0080572 A1 Jun. 27, 2002

(51) Int. Cl.[7] .................................................. G06F 1/16
(52) U.S. Cl. ..................... 361/685; 361/725; 312/332.1; 360/98.01
(58) Field of Search ................................ 361/685–686, 361/683–684, 724–727; 360/97.01, 98.01, 137, 137 D; 312/332.1, 333; 439/131; D14/100, 107; 235/380

(56) References Cited

U.S. PATENT DOCUMENTS

| | | | |
|---|---|---|---|
| 3,543,662 A | 12/1970 | Erlichman | 95/11 |
| 3,833,427 A | 9/1974 | Land et al. | 136/111 |
| 5,584,043 A | 12/1996 | Burkart | 395/822 |
| 5,777,903 A | 7/1998 | Piosenka et al. | 364/700 |
| 5,793,609 A | 8/1998 | Mecredy et al. | 361/695 |
| 6,019,284 A | 2/2000 | Freeman et al. | 235/380 |
| 6,138,245 A * | 10/2000 | Son et al. | 713/400 |
| 6,149,319 A | 11/2000 | Clark et al. | 395/750.01 |
| 6,249,427 B1 * | 6/2001 | Carroll | 361/683 |
| 6,309,230 B2 * | 10/2001 | Helot | 439/131 |

FOREIGN PATENT DOCUMENTS

| | | |
|---|---|---|
| DE | 19609732 | 9/1997 |
| DE | 20109810 | 9/2001 |
| EP | 0887742 | 12/1998 |

* cited by examiner

*Primary Examiner*—Darren Schuberg
*Assistant Examiner*—Hung Van Duong
(74) *Attorney, Agent, or Firm*—Ivan Posey

(57) ABSTRACT

A single storage device includes both a data storage unit and a power supply. The storage device is adapted to connect to a portable device to which data is sent and/or from which data is received, such as a digital camera or a personal digital assistant. The storage device preferably provides primary power to the portable device to which it is connected. A reader is provided for connecting to the storage device and reading data from and/or transmitting data to the data storage unit of the storage device. The reader is also adapted to recharge the power supply of the storage device.

24 Claims, 1 Drawing Sheet

DATA AND POWER STORAGE DEVICE

FIELD OF THE INVENTION

The present invention relates to data storage and power supply accessories for devices that process data, including but not limited to, digital cameras and personal digital assistants.

BACKGROUND OF THE INVENTION

Portable digital devices such as digital cameras and personal digital assistants (PDAs) have revolutionized the capture of information and its movement across the Internet. Digital cameras capture images in extremely high resolution and store those images in a format that can be rapidly transferred without degrading quality. PDAs provide access to a palm size computer to perform simple tasks, such as storing phone numbers, as well as more complicated tasks, such as logging onto the Internet and downloading files from remote processors.

The extraordinary ability of these portable devices to process information comes at the price of significant power and memory consumption. The problem of power consumption is more apparent with digital cameras than PDAs. Digital cameras often use a flash. Digital cameras typically also consume significant computing power, hence significant electrical power, to process data-heavy images. When a digital camera or PDA exhausts its power-source, the user must replace or replenish the power source in order to continue operating the portable device. Some portable devices may be recharged, but many digital cameras and PDAs still require batteries that cannot be recharged. Thus, users must frequently locate and purchase new batteries for the portable device.

Some portable devices use interchangeable memory storage devices such as flash memory or removable hard disks to store data collected by those portable devices. However, one byproduct of such removable memory is that the batteries for the portable device are frequently depleted before the removable memory storage device is filled. Such depletion is inconvenient for the user and can interfere with his or her use of the portable digital device. Further, the need to switch batteries as well as memory storage devices leads to the need to have a number of different storage media on hand, and the concomitant need for some kind of organizer or the like to ensure that those media are accessible and that they are not lost. Such a need to carry storage media and media organizers obviates the convenience of the portable digital device.

SUMMARY OF THE INVENTION

Embodiments of the present invention relate to data storage and power supply accessories for devices that process data, including, but not limited to, digital cameras and PDAs.

In one aspect of a preferred embodiment, a storage device includes both a data storage unit and a power supply. The data storage unit of the storage device is adapted to connect to a device to which data is sent and/or from which data is received, such as a digital camera or PDA. The power supply of the storage device provides primary power to the device to which it is connected. By combining the data storage unit and the power supply, battery replacement is obviated, and downtime of the device is reduced.

In another aspect of a preferred embodiment, a reader is provided for connecting to the storage device and reading data from and/or transmitting data to the data storage unit of the storage device. The reader is also adapted to recharge the power supply of the storage device.

BRIEF DESCRIPTION OF THE DRAWINGS

The drawings illustrate the design and utility of preferred embodiments of the present invention, in which similar elements are referred to with common reference numerals.

DETAILED DESCRIPTION OF THE PREFERRED EMBODIMENTS

In accordance with preferred embodiments of the present invention, data storage capacity and power storage capacity are combined in a single storage device for portable devices that process data, including but not limited to, digital cameras, PDAs, wireless telephones, and laptop computers.

Figure 1:
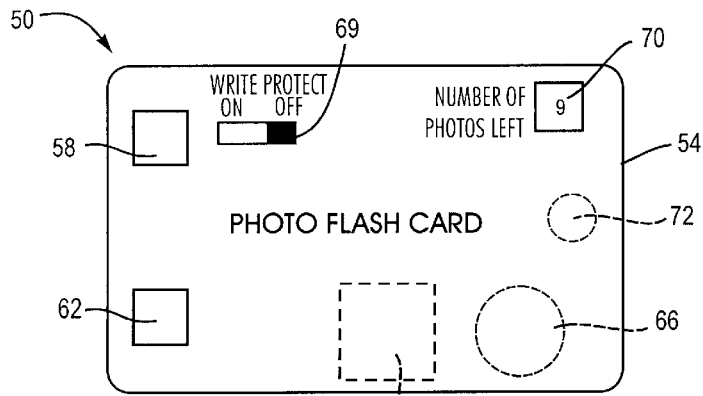
FIG. 1 is a schematic illustration of an embodiment of a storage device.

FIG. 1 shows a storage embodiment in accordance with a preferred embodiment of the present invention. In the illustrated embodiment, the storage device is a chip card 50 with a rechargeable battery pack. The chip card 50 includes a body 54, a data interface 58, a power interface 62, a power supply 66, and a data storage unit 68 that includes memory for storing information. The body 54 is preferably constructed of PVC or other plastic, but may be constructed of other materials such as metal or the like. In preferred embodiments, the body 54 is molded into a shape that encloses the internal components of the chip card 50 and accommodates use of the storage device with a portable device such as a digital camera, PDA, wireless telephone, or laptop computer. In the illustrated embodiment, the body 54 is shaped in the form of a thin card. However, the configuration of the body 54 is not critical, and the body 54 of the storage device may take a variety of shapes, such as a cartridge, rod, or non-symmetrical shape.

The data storage unit 68 within the chip card 50 preferably includes rewriteable memory for data storage, which is more convenient and cost effective for users. Examples of rewriteable memory include, but are not limited to, SRAM, DRAM and EEPROM memory, which are standard in the art. The data storage unit 68 preferably also includes circuitry for operating the memory and for interfacing with the portable device via the data interface 58 and the power interface 62.

The data interface 58 is connected to the data storage unit 68. The outer surface of the data interface 58 is preferably substantially flush with the surface of the body 54 of the chip card 50. However, other configurations of the data interface 58 are possible. When the chip card 50 is inserted into a portable device (not shown), the data interface 58 preferably comes into contact with the portable device such that the portable device and the chip card 50 can exchange information. While the data interface 58 is preferably an electrical contact, the data interface 58 may also be contactless. In another embodiment, a physical contact is not provided, and the data interface 58 may provide communication between the chip card 50 and the portable device by wireless signals, including but not limited to, radio frequency (RF) signals, optical signals such as infrared signals, signals over a PCS or cellular telephone transmission, or capacitive and inductive coupled signals. Further, the data interface 58 may be an optical contact rather than an electrical contact.

The power supply 66 is preferably a rechargeable battery, such as a lithium hydride battery or a nickel cadmium battery. However, any other suitable power source may be used, such as a conventional non-rechargeable battery, or a fuel cell. Additionally, the power supply 66 may include a number of separate batteries or other power sources, connected serially, in parallel, or in another configuration. Further, the power supply 66 preferably stores enough power to allow a user sufficient operating time to fill the memory of the chip card 50 in applications where the chip card 50 is used to collect data. For example, if the chip card 50 stores fifty digital images for a digital camera, and an average user spends four hours operating the camera to take fifty images, the power supply 66 stores at least four hours worth of power. If the chip card 50 is used to replay data rather than collect data, the capacity of the power supply 66 is chosen to support the use of the data card 50 for a reasonable period of time. As another example, if the chip card 50 stores a number of digital music files, the power supply 66 may be adapted to store enough power to replay those files at a normal volume for at least ten hours.

The power interface 62 is connected to the power supply 66, which provides power to the portable device into which the chip card 50 is inserted or connected. When the chip card 50 is connected to the portable device, the power interface 62 makes an electrical connection with a corresponding power terminal (not shown) on the portable device. The power interface 62 may be an electrical or optical contact with the portable device, or a wireless interface, such as a capacitive and an inductive coupled signal, as described above. Because the power interface 62 also connects to the power supply 66, the power interface 62 provides primary power to the portable device when the chip card 50 is inserted into or connected to the portable device. In other words, the chip card 50 provides the main source of power consumed by the portable device. Thus, the portable device may also utilize a secondary power source, such as a battery, which maintains certain data functions of the portable device. For example, the secondary power source may maintain a clock and user settings on the portable device. However, the chip card 50 preferably provides the bulk of the power consumed by the portable device. If the portable device is a digital camera, the chip card 50 as the primary power source preferably provides power to a flash, a display such as a liquid crystal display (LCD) screen, and the computer components used to capture and process an image—that is, all of the components required to take a digital photograph—on the digital camera. The secondary power source may, for example, power a clock within the digital camera so that removing the memory chip card 50, i.e., the primary power source, does not cause the digital camera to lose date or time information. However, the secondary power source is optional and may be omitted. The power supply 66 in the chip card 50 also preferably powers the chip card 50 itself.

The chip card 50 may optionally include a display 70 which shows a measure of the utilized or available memory in the chip card 50. When the chip card 50 is used with a digital camera, the display 70 may indicate the number of photos left that the data storage unit 68 can accommodate or the number of photographic images stored within the chip card 50. The chip card 50 may also include a switch, or accept input from the portable device with which the chip card 50 is used, which a user may utilize to switch the display 70 between a setting where the space remaining in storage is shown and a setting where the space filled with data is shown. Preferably, the display 70 is an LCD film that maintains an image, when the power is disconnected. In this way, the chip card 50 can extend the power supply 66 by not requiring power to continue maintaining the information on the display 70. The display 70 may also include a back light powered by the power supply 66, such that a user may see the display 70 in low light conditions. In another embodiment, the display 70 is adapted to show an image or other data stored within the chip card 50 at the request of the user.

In addition to or instead of the display 70, the chip card 50 may optionally include a speaker 72 that produces an audible signal, depending on the amount of memory left on the chip card 50. For example, in the case of a digital camera used with the chip card 50, the speaker 72 may produce a sound when only three pictures remain on the chip card 50. This would help avoid a mistake where a user wanted to take a series of pictures, but was unaware that the chip card 50 memory had been filled. Once the user hears the signal, the user may swap the chip card 50 for another chip card 50 or instead may overwrite the images stored on the chip card 50. The chip card 50 need not itself provide any information to the user regarding its storage capacity, but instead may provide data related to its available memory to the portable device in which the chip card 50 is used. The portable device itself may display the available memory to the user, or may simply utilize that information internally, if at all.

The chip card 50 may also optionally include a write-protect switch 69. A user may protect information stored on the chip card 50 by engaging switch 69, thereby preventing the portable device from overwriting the information stored on the chip card 50. The switch 69 may also be disengaged, thus allowing the portable device to overwrite the information stored on the chip card 50. The switch 69 may implement the write-protection function mechanically or electronically. In one embodiment, the switch 69 is mechanical, such that the portable device includes a mechanism for detecting the position of the switch 69 and thus enabling or disabling write operations based on the position of the switch 69. In another embodiment, the switch 69 may electronically disconnect the memory within the data storage unit 68 to prevent data stored within the memory from being overwritten by the portable device.

The body 54 of the chip card 50 is shaped in such a way as to detachably connect to the portable device (not shown), such as a digital camera or a PDA. The portable device may include a slot into which a chip card 50 may be inserted, bringing the data interface 58 and the power interface 62 into contact with corresponding contacts in the portable device. While the chip card 50 is in communication with the portable device, the chip card 50 is adapted to provide primary power to the portable device. As the user operates the portable device and generates information, that information may be transferred through the data interface 58 and stored on the chip card 50. If the data interface 58 and/or the power interface 62 are wireless, the chip card 50 need not be placed in direct physical contact with the portable device, but may instead be placed in sufficient proximity to the portable device to allow power and data to be transmitted as described above.

Figure 2:
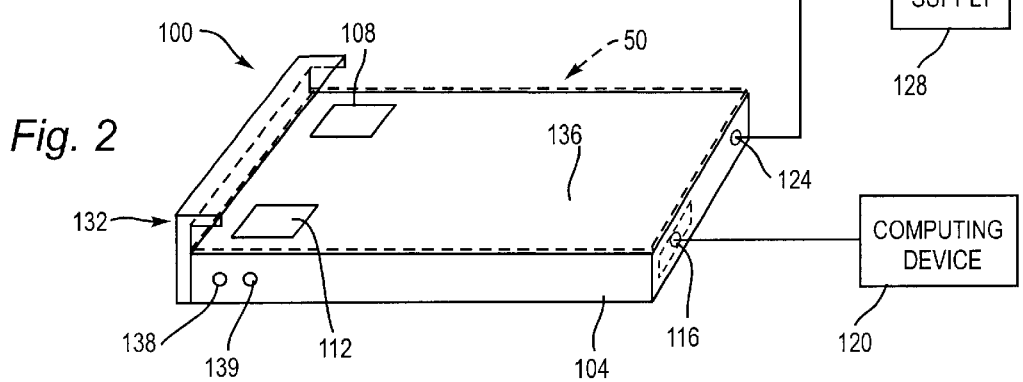
FIG. 2 is a schematic illustration of an embodiment of a reader with the storage device connected to it, wherein the storage device is shown schematically by dashed lines for clarity.

FIG. 2 shows a reader 100 in accordance with a preferred embodiment of the present invention. The reader 100 is adapted to transmit data to and receive data from the chip card 50. The reader 100 includes a body 104, a first power connector 108, a first data connector 112, and a reader power supply 128. In one embodiment, the reader 100 is adapted to physically receive the chip card 50, and the first power connector 108 and the first data connector 112 are positioned on the reader 100 to correspond to the positions of the data interface 58 and the power interface 62 on the chip card 50. The first power connector 108 is adapted to connect to the power interface 62 and transfer power to the chip card 50 via the power interface 62. The first power connector 108 is electrically connected to a second power connector 124, which in turn is connected to the reader power supply 128. The reader power supply 128 preferably includes a transformer adapted for connection to a standard AC power socket as in a residence or business. The reader power supply 128 may also include a regulator and/or a charge controller, as well as other hardware adapted to convert standard AC power to a form useful for transmission to the chip card 50. However, the reader power supply 128 may be a transformer or a direct connection attached to a DC power source, such as a cigarette lighter in an automobile. Power supplies 128 for both AC and DC power are standard and commercially available.

The first data connector 112 is adapted to connect to the data interface 58 on the chip card 50 and transfer data between the reader 100 and the chip card 50. In one embodiment, the first data connector 112 is electrically connected to a second data connector 116, which in turn connects to an external device 120, such as a computer, a data storage device, or a communications network. In this embodiment, the reader 100 acts as a pass-through device, wherein data is transferred between the external device 120 and the chip card 50 at the control of the external device 120 or the chip card 50, the reader 100 acting primarily as an adapter for receiving the chip card 50.

In another embodiment, the reader 100 may also include an information handling unit (not shown) capable of directing the transfer of data to and from the reader 100. The information handling unit may also be capable of storing data for transfer to or from the chip card 50. In this embodiment, the reader 100 may be used as a standalone device for transferring data to and from the chip card 50. The information handling unit preferably includes or is connected to one or more memory chips or other memory storage structures, such as SRAMs, DRAMs or EEPROMs, or a disk drive. The information handling unit also may be used in applications where the reader 100 is connected at least intermittently to an external device 120 via a second data connector 116, in which case the information handling unit may be used as a memory buffer, or may serve another function useful in the transfer of data to or from the chip card 50.

Referring to FIG. 2, the chip card 50 is illustrated with a dashed line so as not to obscure the operable components of the reader 100. The body 104 may include a lip 132 that secures a chip card 50 when the chip card 50 is placed on a top bed 136 of the body 104. A portion of the chip card 50 may be placed underneath the lip 132 and rotated down towards the top bed 136 of the body 104. Alternatively, the chip card 50 may be slid along the surface of the top bed 136 until a portion of the chip card 50 comes to rest underneath the lip 132. Once the chip card 50 is on the top bed 136, the first power connector 108 and the first data connector 112 come into contact with the data interface 58 and power interface 62 of the chip card 50. The reader 100 then may supply recharging power from the reader power supply 128 to the chip card 50 through the first and second power connectors 108 and 124.

The reader 100 may also include a light 138 or other indicator or display associated with the transfer of data to or from the reader 100. The light 138 is preferably a light emitting diode (LED), but may also be an incandescent or fluorescent bulb, or any other suitable illumination device. After the reader 100 retrieves all of the information from the chip card 50, the light 138 illuminates, indicating that all of the information has been retrieved from the chip card 50. In an embodiment in which the reader 100 is connected to an external device 120 via a second data connector 116, the light 138 is preferably controlled by the external device 120, and is preferably connected to the external device 120 via the second data connector 116 or a bus or other electrical wiring connected to the second data connector 116. In this way, the external device 120 monitors the status of a data transfer operation and activates the light 138 when it is complete. In an embodiment in which the reader 100 includes an information handling unit, the light 138 preferably is electrically connected to the information handling unit, which monitors the status of a data transfer operation and activates the light 138 when it is complete.

The reader 100 may further include another light 139 to indicate that the chip card 50 has been fully charged. The light 139 is preferably an LED, but may also be an incandescent or fluorescent bulb, or any other suitable illumination device. In one embodiment, the light 139 is connected to the reader power supply 128. In this embodiment, circuitry associated with the reader power supply 128 controls the light 139, such that the light 139 is switched on when power substantially ceases flowing from the reader power supply 128 to the chip card 50. In another embodiment, the external device 120 monitors the flow of power from the reader power supply 128 to the chip card 150 and is electrically connected to the light 139 via the second data connector 116. In this embodiment, the external device 120 activates the light 139 when the chip card 50 has been fully charged.

In other embodiments, both lights 138 and 139 may be integrated into a single light that illuminates when both data retrieval and power recharging are complete. In further embodiments, a sound source (not shown) such as a speaker or piezoelectric device may be used in conjunction with, or in lieu of, the lights 138 and 139.

Figure 3:
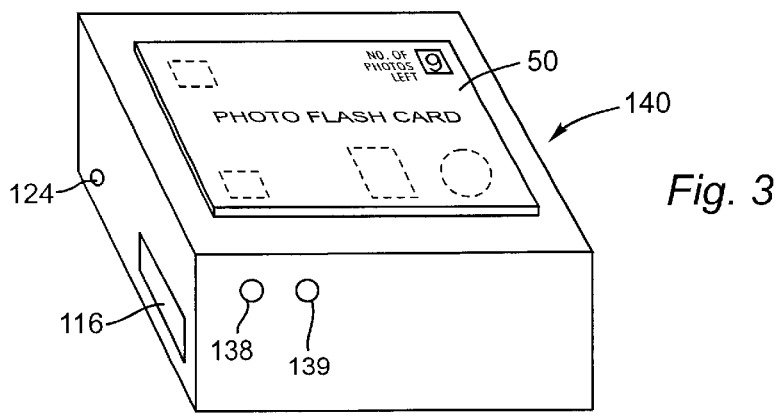
FIG. 3 is a schematic illustration of another embodiment of a reader with a wireless data and power interface.

Referring to FIG. 3, a wireless reader 140 is shown, in which the wireless reader 140 has a wireless power and data interface with a chip card 50. This embodiment operates in the same manner as the embodiment described above in regard to FIG. 2. The wireless reader 140 may function in conjunction with an external device 120 through a second data connector 116, or as a standalone reader 100 having an information handling unit. The chip card 50 which is utilized with the wireless reader 140 has components adapted for wireless data and/or power transfer. The chip card 50 preferably need not be placed in direct physical contact with the wireless reader 140 for data and power transfer to occur. For convenience, the chip card 50 may be placed on top of the wireless reader 140. Operation of the wireless reader 140 preferably is handled in the same manner as the reader 100, with the only difference preferably being the use of a wireless data interface 58 and/or power interface 62 in the chip card 50, in conjunction with a corresponding wireless first power connector 108 and first data connector 112. The wireless transmission of data and/or power is handled as described above.

Figure 4:
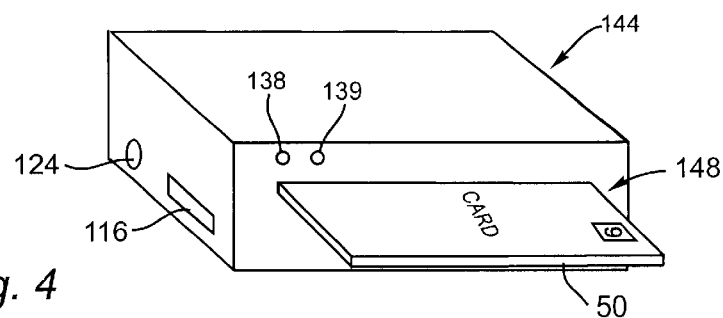
FIG. 4 is a schematic illustration of another embodiment of a reader containing a slot for accepting a storage device.

Another configuration for a reader 144 is depicted in FIG. 4. This embodiment of the reader 144 contains a slot 148 into which the chip card 50 may be inserted. Within the slot 148, the reader 144 contains the necessary contacts to retrieve information from the chip card 50 and supply power to the chip card 50. The reader 144 of this embodiment preferably operates in a manner similarly to the reader 100 described above.

A preferred data and power storage device, and many of its attendant advantages, has thus been disclosed. It will be apparent, however, that various changes may be made in the form, construction and arrangement of the parts without departing from the spirit and scope of the invention, the forms hereinbefore described being merely preferred or exemplary embodiments thereof. Therefore, the invention is not to be restricted or limited except in accordance with the following claims and their legal equivalents.

What is claimed is:

1. A storage device for detachable connection to an external portable device, comprising:

a body;

a data storage unit attached to said body;

a data interface connected to said data storage unit and adapted for connection to the external device, data capable of being transferred between said data storage unit and the external device through said data interface;

a power supply attached to said body; and a power interface electrically connected to said power supply and adapted for electrical connection to the external device, power capable of being provided from said power supply to the external device through said power interface.

2. The storage device of claim 1, wherein said data storage unit comprises rewriteable memory.

3. The storage device of claim 1, further comprising a write-protect switch connected to said data storage unit, said write-protect switch capable of enabling and disabling write operations to the storage device.

4. The storage device of claim 1, further comprising a display connected to said data storage unit and adapted to show information relating to said data storage unit.

5. The storage device of claim 1, further comprising a sound source connected to said data storage unit and capable of providing audible information relating to said data storage unit.

6. The storage device of claim 1, wherein said power supply comprises at least one rechargeable battery.

7. The storage device of claim 1, wherein said data interface comprises a contact on a surface of said body.

8. The storage device of claim 1, wherein said data interface is wireless.

9. The storage device of claim 1, wherein said power interface comprises a contact on a surface of said body.

10. The storage device of claim 1, wherein said power interface is wireless.

11. A reader adapted to interface between a storage device and an external device, the storage device having a storage device power supply and data stored thereon, the reader comprising:

a reader power supply;

a power connector adapted for electrical connection to said reader power supply and the storage device power supply, power capable of being transferred from said reader power supply to the storage device power supply through said power connector;

a first data connector adapted for connection to the storage device, data capable of being transferred between the storage device and the reader through said first data connector; and a second data connector connected to said first data connector and adapted for connection to the external device, data capable of being transferred between the reader and the external device through said second data connector.

12. The reader of claim 11, wherein said reader power supply further comprises a regulator and a charge controller.

13. The reader of claim 11, further comprising an indicator adapted to produce a signal when the storage device power supply has been charged.

14. The reader of claim 11, further comprising an indicator adapted to produce a signal when the reader has transferred the stored data from the storage device to the external device.

15. The reader of claim 11, further comprising an information handling unit connected to said first data connector and said second data connector.

16. The reader of claim 11, wherein said first data connector comprises a contact adapted to place the reader in communication with the storage device.

17. The reader of claim 11, wherein said first data connector is wireless.

18. The reader of claim 11, wherein said second data connector comprises a contact adapted to place the reader in communication with the external device.

19. The reader of claim 11, wherein said second data connector is wireless.

20. The reader of claim 11, wherein said power connector further comprises:

a first power connector adapted for electrical connection to the storage device power supply, power capable of being transferred from the reader to the storage device power supply through said first power connector; and a second power connector electrically connected to said first power connector and adapted for electrical connection to said reader power supply, power capable of being transferred from said reader power supply to said first power connector through said second power connector.

21. The reader of claim 20, wherein said first power connector comprises a contact adapted to place the reader in communication with the storage device.

22. The reader of claim 20, wherein said first power connector is wireless.

23. The reader of claim 20, wherein said second power connector comprises a contact adapted to place said first power connector in communication with said reader power supply.

24. The reader of claim 20, wherein said second power connector is wireless.

* * * * *